United States Patent [19]

Voyles et al.

[11] 4,001,655
[45] Jan. 4, 1977

[54] COMPRESSIBLE INTERMEDIATE LAYER FOR ENCAPSULATED ELECTRICAL DEVICES

[75] Inventors: Gerald A. Voyles, Indianapolis; William D. Davies, Greencastle, both of Ind.

[73] Assignee: P. R. Mallory & Co. Inc., Indianapolis, Ind.

[22] Filed: Jan. 10, 1974

[21] Appl. No.: 432,181

[52] U.S. Cl. .................... 317/230; 357/72; 174/52 PE
[51] Int. Cl.² .................. H01G 9/00; H01L 23/28; H02G 13/08; H05K 5/00
[58] Field of Search ........ 317/230, 234 E; 357/72; 174/52 PE

[56] References Cited
UNITED STATES PATENTS

| | | | |
|---|---|---|---|
| 3,152,293 | 10/1964 | Ruben | 317/234 E |
| 3,254,282 | 5/1966 | West | 317/234 E |
| 3,440,589 | 4/1969 | Minks | 174/52 PE |
| 3,564,109 | 2/1971 | Ruechardt | 317/234 E |
| 3,670,091 | 6/1972 | Frantz et al. | 317/234 E |
| 3,824,328 | 7/1974 | Ting et al. | 317/234 E |

FOREIGN PATENTS OR APPLICATIONS

| | | | |
|---|---|---|---|
| 910,063 | 11/1972 | United Kingdom | 317/234 E |

*Primary Examiner*—Andrew J. James
*Attorney, Agent, or Firm*—Hoffmann & Meyer

[57] ABSTRACT

An electrical device is provided with a compressible intermediate layer between an active electrical component and an exterior protective coating. The intermediate layer includes a substantially solid filler material in a resin binder material. The compressive intermediate layer helps to protect a fragile electrical component from stresses resulting from possible shrinkage of the protective coating during curing or hardening, from expansion or contraction of the protective coating during temperature cycling and from the adhesive nature of the protective coating.

12 Claims, 1 Drawing Figure

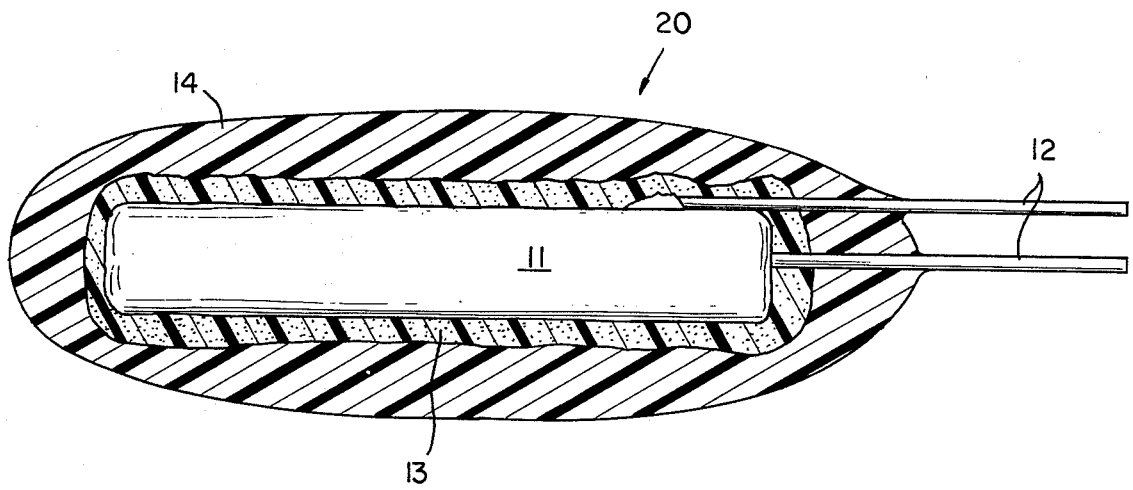

COMPRESSIBLE INTERMEDIATE LAYER FOR ENCAPSULATED ELECTRICAL DEVICES

This invention relates to the construction of electrical devices, and more particularly to a combination insulating and protective intermediate layer between an active or passive electrical component and an exterior coating encapsulating the component to provide an electrical device.

Many electrical devices require some type of external protective means to help protect fragile and sensitive electrical components from harmful mechanical shock and from detrimental effects of an external atmosphere, such as the effects of moisture and other atmospheric contaminants, which may adversely affect the electrical characteristics of such devices. A protective means such as an exterior continuous protective coating layer composed of a suitable resin, either a thermosetting or thermoplastic resin, helps protect such electrical devices from the named effects. A continuous resin protective coating layer is advantageous because, typically, it is easily applied to the electrical components, such as dipping, brushing, spraying, molding and the like. Such a layer is electrically insulative and has good resistance to mechanical shock due to its impact strength, and it is able to provide, under many operating conditions, suitable protection from contaminants that may be present in the atmosphere.

While such a continuous protective coating layer helps to protect the electrical components of the device from shock and the harmful effects of the surrounding external atmosphere, the protective coating layer may introduce new harmful effects to the satisfactory performance of the device. Such effects may include shrinkage of the protective coating layer upon curing or hardening resulting in harmful pressures being exerted on the electrical component. Also, if the coefficient of thermal expansion for the electrical component and the protective coating layer are not substantially equal, such as the coefficient for the protective coating layer being less than that of the components, additional harmful compressive pressures can be exerted against the electrical component during subjection to elevated temperature cycling. Thus, the electrical component would tend to expand at a faster rate than the protective coating layer when the temperature of the device was increased, thereby causing the layer to exert pressure against the component. If the coefficient of thermal expansion of the protective coating layer is greater than that of the component, the protective coating layer may exert harmful compressive pressures against the component when the temperature of the device was decreased below ambient temperatures.

The adhesive nature of the protective coating layer to the surface of the electrical component, while desirable for good protection of the electrical component by maintaining the continuous nature of the coating, can have a detrimental effect on the electrical component due to adhesion of the protective coating layer to the surface of the component during a temperature cycling which may create harmful stresses at the interface between the layer and the surface of the device. These stresses are caused by an expansion of the protective coating layer at a rate different from the expansion rate of the electrical component and the adhesion of the protective coating layer creating tensional forces at the surface of the component during temperature cycling.

Any of the above stresses may result in harmful spalling, cracking or fracturing of the protective coating layer or of the electrical component or both to relieve built up pressures. Such effects may reduce the ability of the device to withstand further temperature cycling, may harmfully affect the electrical characteristics of the device, break the seal allowing harmful atmospheric contamination or, perhaps, even be a cause of a complete failure of the device.

Efforts to avoid the above problems have been directed toward the use of an intermediate layer between the protective coating layer and the components of the electrical device such as certain elastomeric materials and resin foams. Generally, elastomeric materials have limited compressibility and, therefore, do not relieve harmful compressive stresses to the required degree. Elastomeric materials are also fairly expensive and may be difficult to apply. Typically, resin foams are difficult to apply and to obtain adequate coverage, especially to small electrical devices such as minute capacitor anodes.

It is therefore, a feature of the present invention to significantly reduce the potential compressive pressures experienced by a component of an electrical device due to shrinkage of a protective coating layer. Another feature of the present invention is to significantly reduce the potential compressive pressures experienced by a component of an electric device due to unequal expansion or contraction between the protective coating layer and the components of the electrical device during temperature cycling. Another feature of the present invention is that harmful adhesive forces between the protective coating layer and the components of the electrical device are substantially reduced. It is yet another feature of the invention that encapsulation of the electrical component of the device is relatively easy and inexpensive.

Generally, the present invention comprises a compressible and electrically insulative intermediate layer between the outer protective coating layer (encapsulant) and the active or passive component of an electrical device. Such an intermediate layer provides a suitable means to help relieve compressive forces and other stresses experienced by the component such as the stresses produced by the expansion or contraction of the protective coating layer or the component.

More specifically, the compressible intermediate layer includes a solid filler material in a binder material. The filler material may be any material that is solid, electrically insulating, chemically inert to the binder material, and able to be finely divided. Suitable filler material is asbestos powder, mica powder, talc, calcined kaolin, silicon dioxide and orlon, nylon, glass fibers or powders and the like.

The binder material of the intermediate layer may be any resin or a mixture of resins having a low curing or hardening temperature, a relatively low adhesion characteristic to the surface of the electrical component, a minimal amount of shrinkage upon curing or hardening, and chemically inert to the solid filler material. Suitable resins for the binder material are resins such as epoxy, vinyl, phenoxy, polyester, silicone, phenolic, alkyd, fluorocarbons, mixtures thereof and the like. The filler material is solid as distinguished from collapsible or breakable gas filled spheres such as air-filled glass microspheres as disclosed in U.S. Pat. No. 3,670,091.

Usually the mixture of binder and solid filler material to be used to provide the intermediate layer is quite viscous and thereby may be difficult to apply uniformly to a surface of the electrical component. The mixture to provide the intermediate layer may, therefore, contain a solvent or carrier to help reduce the viscosity of mixture to facilitate application of the mixture to the component. The solvent is removed such as by evaporation during curing or hardening and is, therefore, not an integral part of the intermediate layer although trace amounts may be present in such layer. The solvent should be chemically inert to the binder material and to the solid filler material and should have a relatively low vaporization temperature, preferably below 100° C. A relatively low vaporization temperature for the solvent is required to insure that substantially all of the solvent is driven off during the curing cycle and to eliminate high curing temperatures that could damage the electrical component. Examples of suitable solvents for phenolic resins are ethylene glycol monoethyl ether acetate and diethylene glycol monobutyl ether acetate.

Preferably, the intermediate layer comprises, before application to an electrical component, a mixture in the approximate proportions of about 2 wt.% to about 10 wt.% binder material, about 30 wt.% to about 70 wt.% solid filler material, the balance solvent. The preferred solid filler materials are asbestos and mica and the preferred binder material is phenoxy resin.

The intermediate layer is characterized as a fluffy dispersion of the filler material held together by the binder material. The intermediate layer may have small void areas associated therewith which may contribute to the compressibility characteristic of the intermediate layer. It is necessary only that sufficient binder material be present to retain the filler material dispersed fairly uniformly over the surface of the electrical device in order to achieve the desired compressibility characteristic.

Thus in its broadest aspect, the invention comprehends an electrical device comprising an active or passive electrical component means and a compressible intermediate layer means over the component means.

The foregoing features and advantages of the present invention will be more clearly understood when considered in conjunction with accompanying drawing which is a cross-sectional view of an electrical device utilizing the concepts of this invention.

Referring now to the drawing illustrating one embodiment of the invention, an electrical device 20 including an electrical component 11, such as a tantalum anode capacitor, with lead means 12, is substantially surrounded by the intermediate layer 13. The intermediate layer 13 is in turn substantially surrounded by the protective coating layer 14 of thermosetting or thermoplastic resin.

The performance characteristics of the completed device 20 are substantially unaffected by mechanical shock or by contaminants in the atmosphere such as moisture due to the durable encapsulation of the device provided by the protective coating layer 14.

The electrical device 20 is made by suitably applying the protective intermediate layer 13 to the electrical component 11. This application of the intermediate layer 13 can be accomplished by any suitable means such as dipping, brushing, spraying and the like. The intermediate layer 13 is then cured or hardened by evaporating the solvent, if any, to harden or cure the binder material. The protective coating layer 14 is then applied to the exterior surface of the intermediate layer 13 and cured or hardened. More than one protective coating 14 may be applied to the device 20 if desired.

Intermediate layer 13 is sufficiently compressible so as the protective coating layer 14 is cured and thereby shrinks, harmful pressure exerted by the shrinkage of the coating tend to be absorbed by the compressible intermediate layer and the electrical component 11 is substantially unaffected by the shrinkage.

The intermediate layer 13 also tends to absorb harmful compressive forces caused by unequal contraction or expansion of the electrical component 11 relative to the protective coating layer 14 during temperature cycling. Thus if the electrical component 11 expands at a greater rate than the protective coating layer 14 during an increase in temperature of the electrical device 20, the higher expansion rate being due to a higher coefficient of thermal expansion for the component than for the coefficient of the protective coating, the internal forces normally created against the component by the protective coating layer will tend to be absorbed by the compression of the intermediate layer 13 and the component will be substantially unaffected.

If, however, the protective coating layer 14 expands or contracts at a greater rate than that of the electrical component 11 during temperature changes due to a higher coefficient of thermal expansion, the intermediate layer 13 will provide at least two functions. During a temperature decrease below ambient conditions, the intermediate layer 13 will tend to absorb the compressive forces created by the greater contraction of the protective coating layer 14. During temperature increases, the electrical component 11 will not be subjected to adhesive forces pulling against the external surfaces of the component due to intermediate layer 13, since that layer is adhered to and is able to expand at about the same rate with the protective coating layer.

The intermediate compressible layer 13 includes an electrically insulating solid filler material and a binder material, and preferably a solvent or carrier which evaporates upon curing or hardening. Suitable solid filler materials include asbestos, mica, talc, fibrous glass, orlon, calcined kaolin, silicon dioxide, nylon fibers, mixtures thereof and the like. Appropriate binder materials include resins such as epoxy, phenolic, alkyd, vinyl, polyester, silicon, phenoxy mixtures thereof and the like. Many solvents or carriers such as ethylene glycol monoethyl ether acetate, diethylene glycol monobutyl ether acetate and mixtures thereof can be used to facilitate application of the mixture to the electrical component provided the solvent is non-reactive with the binder and solid filler material.

The exterior protective coating layer 14 may be any adhesive synthetic resin which is impact resistant and can be easily applied to the electrical components by such means as dipping, molding, brushing or spraying. Thermosetting resins are usually preferred over thermoplastic resins since electrical devices 20 with protective resin coatings 14 are sometimes subjected to temperatures of 125° C or more and thermoplastic resins may begin to flow at these temperatures. For certain applications, however, thermoplastic resins may be adequate and possibly desirable. Examples of a thermosetting resin suitable for many protective coatings are epoxy resins, phenolic resins, alkyd resins, ureic resins, polyester resins and silicone resins.

Thickness of the intermediate layer 13 is dependent upon the strength of the electrical component 11, the projected stresses to which the component may be subjected, and the characteristics of the protective coating layer 14 to be used to encapsulate the electrical device 20. For small devices such as tantalum anode capacitors, the thickness should be in the range of about 1 mil to about 10 mils. Thicker intermediate layers 13 would be required for larger devices 20 where total dimensional changes due to temperature or curing total are correspondingly greater.

The following are specific examples of the use of undercoat material in the construction of an electrical device.

EXAMPLE I

A tantalum anode capacitor is encapsulated by an epoxy resin protective coating layer with an intermediate layer including asbestos powder and phenoxy resin material between the capacitor component and the epoxy coating layer.

A solid electrolyte, sintered anode tantalum capacitor 11 which has a performance rating of about 8 mfd at 50 volts and has its conductive leads 12 masked, is dipped in a mixture including about 10 wt.% phenoxy resin as a binder, about 60 wt.% asbestos powder as a filler, and about 30 wt.% ethylene glycol monoethyl ether acetate as a carrier or solvent. The asbestos powder used is 325 mesh CRL-81 White Crystotile supplied by the Asbestos Corporation of America, Garswood, N.J. The mixture is then cured by heating the component to about 75° C for about one-half hour to evaporate the solvent and cure the remaining materials of the mixture to provide the intermediate layer 13. The average thickness of the intermediate layer 13 is approximately 2 mils. A protective coating layer 14 of epoxy resin is then applied over the intermediate layer 13 by a suitable dipping technique and cured at about 150° C for about 1 hour. The masking is then removed from the conductive leads 12 to provide an encapsulated capacitor 20.

EXAMPLE II

A transistor is encapsulated by an phenolic resin protective coating with an intermediate layer composed of mica and silicone resin between the transistor component surface and the phenolic protective coating.

A conventional miniature transistor 11, after masking of the conductive leads 12, is sprayed with mixture including about 5 wt.% silicone resin as a binder, about 60 wt.% mica powder as the filler, and about 35 wt.% ethylene glycol monomethyl ether acetate as a solvent. The mica powder used is 325 mesh Muscavite from The English Mica Co, Stamford, Conn. The mixture is then cured by heating the component and mixture to about 85° C for about one-half hour to provide intermediate layer 13. The temperature of the cure process evaporates substantially all of the solvent. The average thickness of the intermediate layer 13 is approximately 3 mils. A protective coating layer 14 of phenolic resin is then applied by dipping over the intermediate layer 13. The protective phenolic coating layer 14 is cured at about 125° C for about 1 hour. After cooling, the masking over the leads 12 is removed to provide an encapsulated transistor 20.

The capacitor and transistor of the above examples are able to withstand the shrinkage which occurs upon curing of the protective coating and are not significantly harmed by unequal expansion or contraction of the electrical components or the protective coating due to changes in temperature in the range from about −50° C to about +125° C.

It should be understood that utilization of the present invention is not limited to the above examples of a capacitor or transistor but comprehends utilization of the invention in any electrical device. Thus the present invention includes an electrical insulating, compressive undercoat layer for use in encapsulating electrical components with a protective external coating, the intermediate layer providing means to relieve potentially harmful stresses on the electrical components.

The term electrical component is used in this disclosure to mean the active and passive component of a finished electrical device, that is, the component which actually performs an electrical function.

The term electrical device is used in this disclosure to mean the totality of active and passive electrical components and the protective coating layer or layers. Thus an encapsulated capacitor would be an electrical device and the anode, cathode, and the leads would be the electrical components of that device.

While the present invention has been described with reference to particular embodiments thereof, it will be understood that numerous modifications may be made by those skilled in the art without actually departing from the spirit and scope of the invention as defined in the appended claims.

We claim:

1. A compressible and electrically insulative intermediate layer between a surface of an electrical component means and a protective coating, the intermediate layer including resin binder with void areas and solid filler material dispersed in the binder and over the surface of the electrical component means to help relieve compressive forces and other stresses that may be experienced by the electrical component means, the intermediate layer consisting of an effective amount up to about 25 wt.%, the remainder essentially solid filler selected from asbestos, mica, fibrous glass, calcined kaolin, silicon dioxide, nylon fiber, orlon, talc or mixtures thereof.

2. An electrical device comprising electrical component means, the compressible and electrically insulative intermediate layer of claim 1 over the electrical component means and a protective coating over the intermediate layer.

3. The electrical device of claim 2, wherein the binder of the intermediate layer is a synthetic resin.

4. The electrical device of claim 3, wherein the resin is a thermoplastic resin.

5. The electrical device of claim 3, wherein the protective coating means is a thermosetting resin.

6. The electrical device of claim 2, wherein the binder of the intermediate layer is phenoxy resin and the filler is selected from asbestos powder, mica and mixtures thereof, and the protective coating means includes epoxy resin.

7. A capacitor comprising an anode, anode lead means projecting from the anode, the intermediate layer of claim 1 over the anode and an encapsulating layer including a resin over the intermediate layer, the anode lead means projecting through the intermediate layer and the encapsulating layer.

8. The intermediate layer of claim 1, wherein the intermediate layer is characterized as a fluffy dispersion of solid filler material held together by the resin binder, the solid filler material being substantially uniformly dispersed over the surface of the electrical component means.

9. The intermediate layer of claim 8, wherein the solid filler material is selected from the group of mica and asbestos, and the resin binder is phenoxy resin.

10. A capacitor comprising an anode, anode lead means projecting from the anode, the intermediate layer of claim 8 over the anode and an encapsulating layer including a resin over the intermediate layer, the anode lead means projecting through the intermediate layer and the encapsulating layer.

11. The capacitor of claim 10 wherein the anode includes tantalum, a solid electrolyte is over the anode, and the binder of the intermediate layer includes a resin.

12. The capacitor of claim 7 wherein the anode includes tantalum, a solid electrolyte is over the anode, the solid filler material of the intermediate layer includes asbestos and the binder of the intermediate layer includes a resin.

* * * * *